US008120425B2

(12) United States Patent
Fayed et al.

(10) Patent No.: US 8,120,425 B2
(45) Date of Patent: Feb. 21, 2012

(54) SYSTEM AND METHOD FOR COMMON MODE TRANSLATION

(75) Inventors: Ayman A. Fayed, Wylie, TX (US); Russell Byrd, McKinney, TX (US); Baher Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/710,928

(22) Filed: Feb. 23, 2010

(65) Prior Publication Data

US 2010/0156497 A1 Jun. 24, 2010

Related U.S. Application Data

(62) Division of application No. 11/729,487, filed on Mar. 29, 2007, now Pat. No. 7,679,443.

(60) Provisional application No. 60/824,181, filed on Aug. 31, 2006.

(51) Int. Cl.
*H03F 3/45* (2006.01)

(52) U.S. Cl. ........ 330/258; 330/252; 330/253; 330/259; 330/260

(58) Field of Classification Search ................... 330/252, 330/253, 258, 259, 260
See application file for complete search history.

(56) References Cited

U.S. PATENT DOCUMENTS

| | | | |
|---|---|---|---|
| 2,927,962 A | 3/1960 | Cutler | |
| 5,838,200 A | 11/1998 | Opris | |
| 5,917,440 A | 6/1999 | Khoury | |
| 5,963,156 A * | 10/1999 | Lewicki et al. | 341/122 |
| 6,252,989 B1 | 6/2001 | Geisler et al. | |
| 6,351,335 B1 | 2/2002 | Perlin | |
| 6,459,335 B1 | 10/2002 | Darmawaskita et al. | |
| 6,515,464 B1 | 2/2003 | Darmawaskita et al. | |
| 6,559,720 B1 * | 5/2003 | Huijsing et al. | 330/253 |
| 6,624,698 B2 * | 9/2003 | Nagaraj | 330/258 |

(Continued)

OTHER PUBLICATIONS

"Design of a 14-Bit Continuous-Time Deita-Sigma A/D Modulator With 2.5MHz Signal Bandwidth", Zhimin Li, Electrical and Computer Engineering, Dissertation submitted to Oregon State University, Retrieved from internet <URL: http//eecs.oregonstate.edu/library/files/2006-5/zhimin_thesis.pdf>.

*Primary Examiner* — Linh Nguyen
(74) *Attorney, Agent, or Firm* — Ronald O. Neerings; Wade James Brady, III; Frederick J. Telecky, Jr.

(57) ABSTRACT

System and method for common mode translation in continuous-time sigma-delta analog-to-digital converters. An embodiment includes a loop filter having an RC network coupled to a differential signal input, a Gm-C/Quantizer/DAC circuit (GQD) coupled to the loop filter, a common-mode level adjust circuit coupled to signal inputs of the GQD, and a tuning circuit coupled to the GQD and the common-mode level adjust circuit. The GQD evaluates an input signal provided by the RC network, computes a difference between a filtered input signal and the feedback quantization signal to generate an error signal, measures the error signal, and compensates for the error signal with sigma-delta noise-shaping. The common-mode level adjust circuit alters a common-mode level of a differential input signal to be substantially equal to a desired common-mode level and the tuning circuit provides a compensation voltage to the common-mode level adjust circuit based on a difference between the common-mode levels.

6 Claims, 5 Drawing Sheets

U.S. PATENT DOCUMENTS

| | | | |
|---|---|---|---|
| 6,697,001 B1 * | 2/2004 | Oliaei et al. | 341/143 |
| 6,876,248 B2 | 4/2005 | Nguyen et al. | |
| 6,909,543 B2 | 6/2005 | Lantz | |
| 6,985,158 B2 | 1/2006 | Miller et al. | |
| 7,024,171 B2 | 4/2006 | Gibbs | |
| 7,053,712 B2 | 5/2006 | Bonaccio et al. | |
| 7,075,348 B2 | 7/2006 | Hsu et al. | |
| 7,099,786 B2 | 8/2006 | Nguyen et al. | |
| 7,233,203 B2 | 6/2007 | Huang | |
| 7,295,070 B2 | 11/2007 | Dillon | |
| 7,304,534 B2 * | 12/2007 | Koller et al. | 330/9 |
| 7,358,805 B2 * | 4/2008 | Shia et al. | 330/69 |
| 7,382,192 B2 * | 6/2008 | Lin | 330/261 |
| 7,436,216 B1 * | 10/2008 | Brunn et al. | 326/83 |
| 7,535,258 B1 * | 5/2009 | Johnson et al. | 326/82 |
| 7,620,121 B1 * | 11/2009 | Tetzlaff et al. | 375/319 |
| 7,755,421 B2 * | 7/2010 | Chen et al. | 330/9 |
| 2002/0175749 A1 | 11/2002 | Hedberg et al. | |
| 2004/0189388 A1 | 9/2004 | Nguyen et al. | |
| 2005/0179491 A1 | 8/2005 | Sobel | |
| 2005/0207596 A1 | 9/2005 | Beretta et al. | |
| 2006/0244532 A1 | 11/2006 | Trifonov et al. | |

* cited by examiner

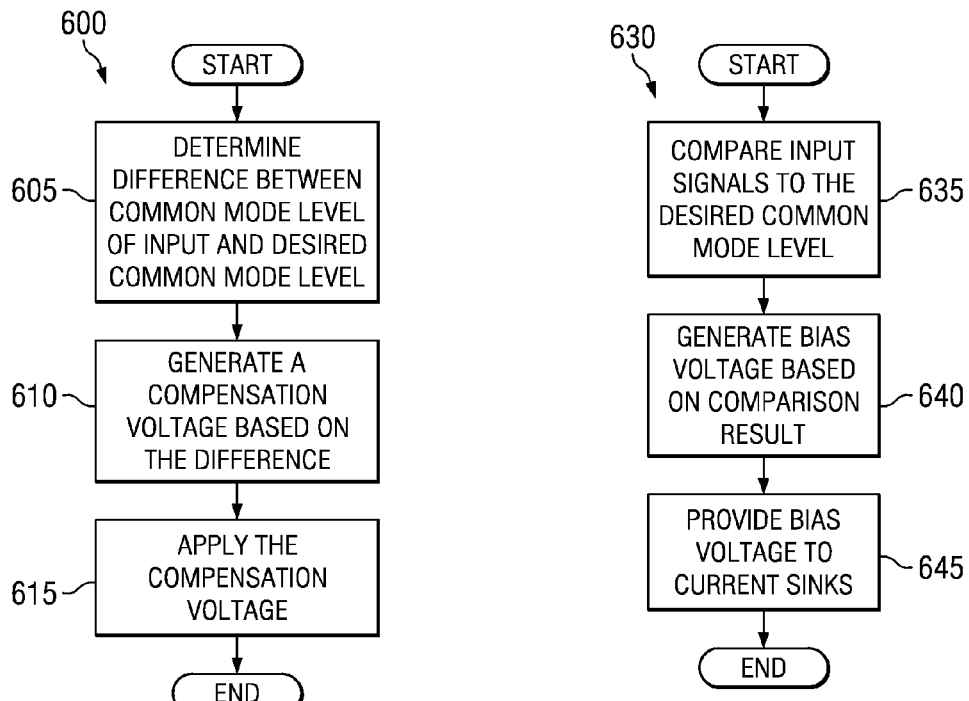
FIG. 6A
FIG. 6B
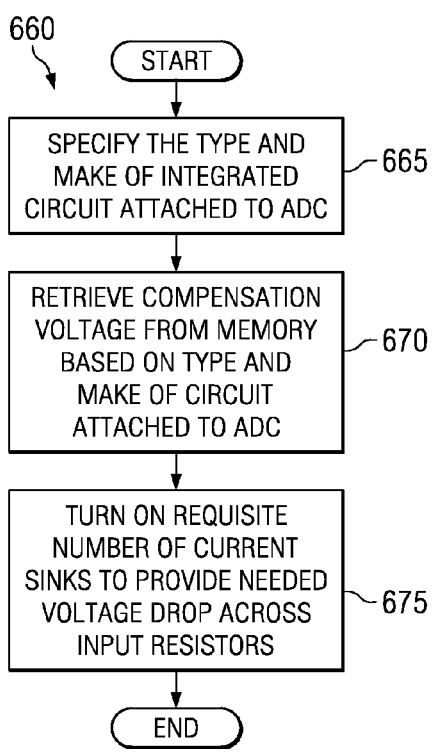
FIG. 6C

SYSTEM AND METHOD FOR COMMON MODE TRANSLATION

This application is a Divisional of application Ser. No. 11/729,487 filed Mar. 29, 2007, now U.S. Pat. No. 7,679,443, which claims the benefit of U.S. Provisional Application No. 60/824,181, filed on Aug. 31, 2006.

TECHNICAL FIELD

The present invention relates generally to a system and method for signal processing, and more particularly to a system and method for common mode translation in continuous-time sigma-delta analog-to-digital converters.

BACKGROUND

A continuous-time sigma-delta analog-to-digital converter (continuous-time sigma-delta ADC) differs from a discrete-time sigma-delta ADC in that the continuous-time sigma-delta ADC makes use of a loop filter while the discrete-time sigma-delta ADC uses a switched-capacitor filter, which may require the use of fast settling circuits and an input buffer to eliminate sample glitches. The switched-capacitor filter may limit the signal bandwidth. Additionally, due to the thermal noise of the capacitors used in the switched-capacitor filters, large capacitors may be needed to obtain good signal-to-noise ratios.

The loop filter may have a topology that is active-Gm-C, active-RC, a combination of active-Gm-C and active-RC, or a combination of active and passive networks. A diagram shown in FIG. 1 illustrates a view of a typical prior art continuous-time sigma-delta ADC 100. The continuous-time sigma-delta ADC 100 includes an input RC network 105 and an active-passive Gm-C/Quantizer/DAC circuit (GQD) 110.

The RC network 105, which may provide passive filtering of the input signals to the continuous-time sigma-delta ADC, may include resistors (R), such as resistors 155 and 156, and capacitors (C), such as capacitors 160 and 161, for the positive and negative signal inputs to the continuous-time sigma-delta ADC 100. The GQD 110 may include a loop filter 170, a quantizer 175, and a feedback loop 180 from a positive and a negative output from the quantizer 175 back to the positive and the negative inputs to the loop filter 170. Summing points combine the signal from the respective feedback loop 180 and the respective input signal and provides it to the loop filter 170. The GQD 110 may evaluate an input signal (provided by the RC network 105), measure an error signal present in the input signal, and provide compensation for the error signal. During normal operation of the GQD 110, a virtual short circuit may be maintained between the positive and the negative inputs of the loop filter 170 due to the GQD's high gain and its negative feedback loop. The feedback loop 180 may include a digital-to-analog converter (DAC) 185 to provide an analog version of the feedback of the quantizer 175 output.

Due to the nature of the GQD 110, the input common mode level of the loop filter 170 may be identical to the common mode level of the input signal. However, if the input signal is to be provided by a separate integrated circuit (for example, an RF chip coupled to the continuous-time sigma-delta ADC 100), the common mode signal levels at the input to the continuous-time sigma-delta ADC 100 could be too high or too low for proper operation and reliability. Therefore, there may be a need to accommodate different common mode levels at the input to the continuous-time sigma-delta ADC 100 to enable reliable and optimal operation between the continuous-time sigma-delta ADC 100 and a variety of RF chips. The common mode level may be higher than a supply voltage of the loop filter 170 in the GQD 110.

If the continuous-time sigma-delta ADC 100 is fabricated using a low-voltage process, reliability issues may arise due to the high common mode level. Even with acceptable common mode levels, during start-up, overload conditions, or power supply loss, when the GQD 110 loop may be incapable of maintaining the summing junction (at the input to the loop filter 170, for example) at the common mode level, the differential swing of the input signal appears at the summing junction and may cause a degradation in the reliability of the continuous-time sigma-delta ADC 100.

SUMMARY OF THE INVENTION

These and other problems are generally solved or circumvented, and technical advantages are generally achieved, by embodiments of the present invention which provide a system and a method for common mode translation in continuous-time sigma-delta analog-to-digital converters.

In accordance with an embodiment, a continuous-time sigma-delta analog-to-digital converter (CT SD ADC) is provided. The continuous-time sigma-delta analog-to-digital converter includes a loop filter having an input resistor-capacitor (RC) network coupled to a differential signal input, a Gm-C/Quantizer/DAC circuit (GQD) coupled to the loop filter, a common mode level adjust circuit coupled to signal inputs of the GQD, and a tuning circuit coupled to the GQD and to the common mode level adjust circuit. The GQD evaluates an input signal provided by the input RC network, computes a difference between a filtered input signal and the feedback quantization signal to generate an error signal, measures the error signal, and compensates for the error signal with sigma-delta noise-shaping. The common mode level, adjust circuit alters a common mode level of a differential input signal to be substantially equal to a desired common mode level, and the tuning circuit provides a compensation voltage to the common mode level adjust circuit based on a difference between the common mode level of the differential input signal and the desired common mode level.

In accordance with another embodiment, a circuit for adjusting a common mode level of a second circuit is provided. The circuit includes a first current supply coupled between a first input of the second circuit and a power rail, and a second current supply coupled between a second input of the second circuit and the power rail. The first input and the second input make up a differential input, and the first current supply and the second current supply provide a current path between a respective input and the power rail based on a control signal provided to the respective current supply.

In accordance with another embodiment, a method for tuning a circuit is provided. The method includes determining a difference between a common mode level of an input signal to the circuit and a desired common mode level, generating a compensation voltage based on the difference, and applying the compensation voltage.

An advantage of an embodiment is that implementation of the embodiment is simple and may be readily added to existing continuous-time sigma-delta analog-to-digital converters without significant modification.

A further advantage of an embodiment is that relatively little integrated circuit real estate is required, helping to keep the cost of the integrated circuit low.

Yet another advantage of an embodiment is that the embodiment enables the tuning of the adjustments to the common mode level. This may allow the use of the embodiment in a wide variety of applications, further enhancing its appeal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 6a through 6c are diagrams of sequences of events used in adjusting a common mode adjust circuit of an exemplary continuous-time sigma-delta ADC.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a continuous-time sigma-delta ADC. The invention may also be applied, however, to other integrated circuits wherein there is a desire to provide common mode level protection, such as in a continuous time sigma-delta DAC, and so on.

Figure 2:
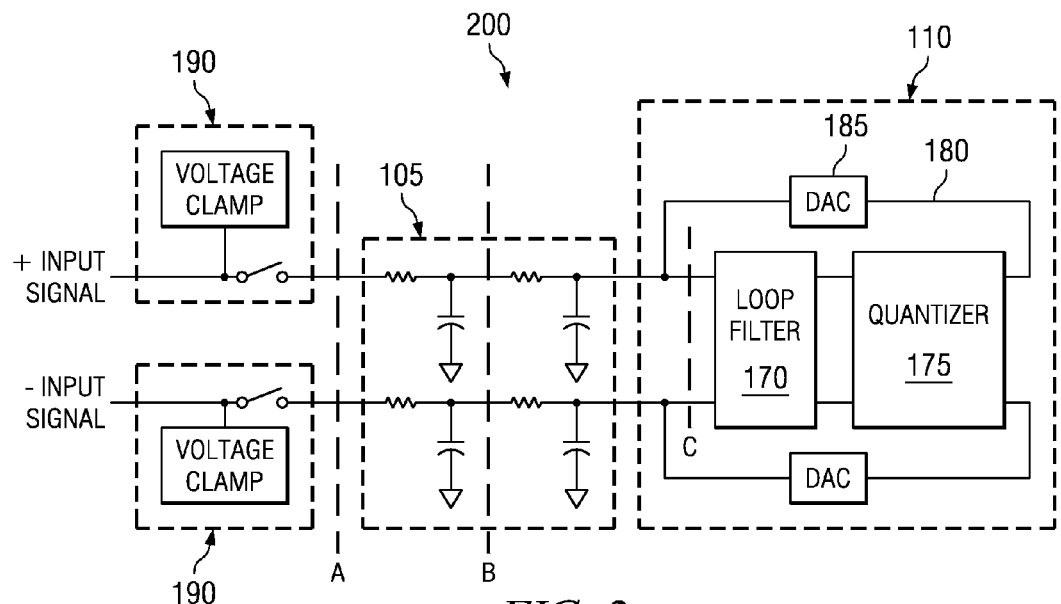
FIG. 2 is a diagram of a prior art technique for providing common mode level protection in a continuous-time sigma-delta ADC.

With reference now to FIG. 2, there is shown a diagram illustrating a continuous-time sigma-delta ADC 200, wherein the continuous-time sigma-delta ADC 200 includes a prior art technique for providing common mode level protection. The common mode level protection comes in the form of a voltage clamp and a series switch 190 for each input to the continuous-time sigma-delta ADC 200. The voltage clamp and the series switch 190 however, only provides high voltage protection without stepping down the common mode level to an optimum value (e.g., about the same as the common mode level produced by the output of the GQD 110). Furthermore, the voltage clamp and the series switch 190 provides high voltage protection at the expense of large area and potentially significant signal distortion and clipping due to the presence of clamps and series switches in the signal path. Additionally, the voltage clamp and the series switch 190 may not be able to be maintained in the event of power supply loss.

Figure 3A:
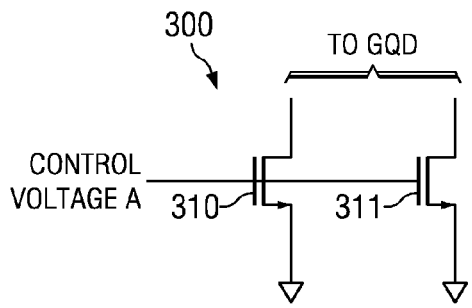
FIGS. 3a through 3c are diagrams of common mode adjust circuits.
Figure 3B:
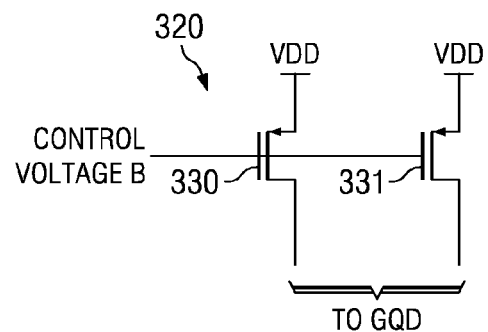
Figure 3C:
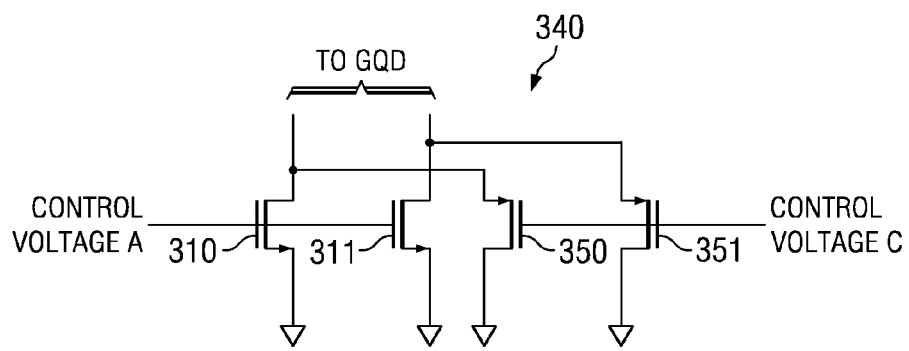

With reference now to FIGS. 3a through 3c, there are shown diagrams illustrating embodiments of common mode level protection circuitry for a continuous-time sigma-delta ADC. In a majority of situations, a common mode level as provided to an input of the continuous-time sigma-delta ADC may be higher than a desired common mode level of the continuous-time sigma-delta ADC. Therefore, a current sink may be used to pull the common mode level down. The diagram shown in FIG. 3a illustrates a circuit 300 containing two current sinks (NMOS transistors 310 and 311, for example). When the NMOS transistors 310 and 311 are turned on (as controlled by a control voltage (also referred to as a biasing voltage) "CONTROL VOLTAGE A" coupled to their gate terminals), a current path is created to ground and the common mode level of the positive input signal is pulled down to a level determined by the voltage drop across resistors coupled to the positive signal input (resistors 155 and 156 of the RC network 105), for example. Similarly, the common mode level of the negative signal input is pulled to a level determined by a voltage drop across resistors coupled to the negative signal input of the RC network 105.

The voltage drop may be determined by the value of the resistors 155 and 156 and by the value of the drain current of NMOS transistors 310 and 311. A first of the two NMOS transistors, for example NMOS transistor 310, may be coupled to the positive signal input of a continuous-time sigma-delta ADC, and a second of the two NMOS transistors, for example NMOS transistor 311, may be coupled to the negative signal input of a continuous-time sigma-delta ADC. Although shown to be NMOS transistors, other types of transistors, such as PMOS, BJT. DMOS, and so forth, may be used with modification to the circuit 300. The illustration and discussion of NMOS transistors should not be construed as being limiting to either the scope or the spirit of the present invention.

Similarly, when the common mode level as provided to the input of the continuous-time sigma-delta ADC may be lower than the desired common mode level of the continuous-time sigma-delta ADC, a current source may be used to provide the current needed to pull the common mode level up. In this case the voltage rise at the positive signal input may be determined by the value of resistors 155 and 156 and the drain current of either of PMOS pull-up transistors 330 and 331 that may be coupled to the positive signal input as the diagram shown in FIG. 3b illustrates. Similarly, the voltage rise at the negative signal input may be determined by the value of resistors coupled to the negative signal input and either of the PMOS pull-up transistors 330 and 331 that may be coupled to the negative signal input. When the PMOS transistors 330 and 331 are turned on (as controlled by a control voltage "CONTROL VOLTAGE B" coupled to their gate terminals), a current path is created to VDD and the common mode level is pulled up. Although shown to be PMOS transistors, other types of transistors, such as NMOS, BJT, DMOS, and so forth, may be used with modification to the circuit 320. The illustration and discussion of PMOS transistors should not be construed as being limiting to either the scope or the spirit of the present invention.

The circuit(s) (circuit 300 and circuit 320 or a combination thereof) may be coupled to a continuous-time sigma-delta ADC at one of several locations. A first location may be at the inputs to the continuous-time sigma-delta ADC, such as the continuous-time sigma-delta ADC 100, (shown as plane A in FIG. 1). If the circuit 300 (or circuit 320 or both) is coupled to the continuous-time sigma-delta ADC 100 at the inputs of the continuous-time sigma-delta ADC 100, then an additional resistor may have to be added to each signal input of the continuous-time sigma-delta ADC 100. The resistor may be needed to produce a voltage drop necessary to shift the common mode level. This may reduce the bandwidth of the input filter (the RC network 105), consume valuable integrated circuit real estate, and attenuate the input signal. Furthermore, the differential signal at the inputs of the continuous-time sigma-delta ADC 100 is a large signal, which may make matching the circuit 300 very difficult due to the finite output resistance of the current sinks.

Figure 1:
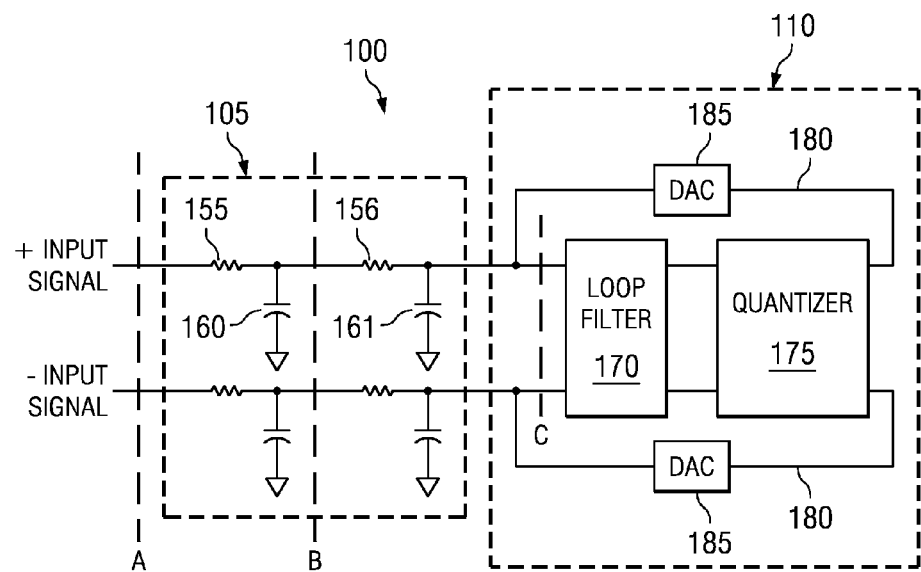
FIG. 1 is a diagram of a typical continuous-time sigma-delta ADC.

A second location may be at the RC network 105 (shown as plane B in FIG. 1). If the circuit 300 is coupled to the continuous-time sigma-delta ADC 100 at the RC network 105, then the resistor 155 may be used to realize the voltage drop needed to shift the common mode level. However, the value of the resistor 155 may typically be smaller than the value of the resistor 156 (normally the resistance of the resistor 155 is about one-half the resistance of the resistor 156), which may mean that the circuit 300 may potentially need to contain high-current current sinks. The use of high-current current sinks to shift the common mode level may consume more power than necessary and may overload the common mode feedback circuit of an output stage of an RF circuit providing the input signal to the continuous-time sigma-delta ADC 100. Additionally, the differential signal at the RC network 105 may still be a large signal (the differential signal at the RC network 105 may be expressed as (resistor 156)/(resistor 155+resistor 156) of the differential signal at the inputs of the continuous-time sigma-delta ADC 100). This may make matching the circuit 300 difficult and cascading may be necessary.

A third location may be the inputs to the GQD 110 (shown as plane C in FIG. 1). If the circuit 300 is coupled to the continuous-time sigma-delta ADC 100 at the GQD 110, then the resistors 155 and 156 may be used to realize the voltage drop needed to shift the common mode level of the positive signal input and corresponding resistors of the RC network 105 may be used to realize the voltage drop needed to shift the common mode level of the negative signal input, implying that the values of the current sinks in the circuit 300 may be at a minimum. Additionally, the differential signal at the inputs to the GQD 110 may be small (due to the virtual short at the inputs to the GQD 110) due to the loop operation. This may eliminate the need for any cascoding of the circuit 300, yielding large headroom. In turn, this may allow for larger overdrive (small transconductance) in the current sinks in the circuit 300 and permit better matching and a negligible noise contribution.

The placement of the circuit 300 at the GQD 110 of the continuous-time sigma-delta ADC 100 may typically be perceived as a source of noise performance degradation for the continuous-time sigma-delta ADC 100 since the circuit 300 is located at a summing junction, where the feedback signal is added to the input signal. Since the noise from the current sinks (NMOS transistors 310 and 311, for example) may not be divided by any gain, a large noise may be added directly to the input signal without any scaling. However, since the current sinks may have large headroom, the current sinks may be designed with large overdrive (i.e., very small transconductance) to help minimize their noise contribution. Furthermore, with wideband input signals, the noise performance of the continuous-time sigma-delta ADC 100 may be dominated by quantization noise rather than flicker or thermal noise of the individual circuit components. Therefore, the addition of the circuit 300 to the continuous-time sigma-delta ADC 100 may have little impact on the noise performance of the continuous-time sigma-delta ADC 100.

Since there is substantially no differential voltage swing present at the input to the GQD 110, the current sinks added in the circuit 300 may not introduce any distortion to the input signal. Any mismatch between the current sinks may appear simply as a DC offset without any harmonics. Additionally, since the circuit 300 does not require any voltage clamps or series switches, significant area (integrated circuit real estate) may be saved and distortion problems associated with voltage clamps and series switches are eliminated.

In an alternative embodiment, the diagram shown in FIG. 3c illustrates a circuit 340 that includes two current sinks (NMOS transistors 310 and 311, for example) and two protection circuits (PMOS transistors 350 and 351, for example). As shown in FIG. 3b, the two current sinks may be replaced with current sources if there is a need to pull the common mode level up to the desired common mode level instead of the need to pull the common mode level down to the desired common mode level. Alternatively, the current sources may be added in addition to the current sinks to provide both a pull up and a pull down capability to adjusting the common mode level. The two protection circuits, PMOS transistors 350 and 351, for example, may be used to protect the loop filter 170 of the GQD 110 from any high voltage from the input signal in the case of a power supply loss, wherein the current sinks, NMOS transistors 310 and 311, for example, will not be operational. The PMOS transistors 350 and 351 may be selected since PMOS devices with the control voltage at their gates "CONTROL VOLTAGE C" may always be low in the case of supply loss. With the control voltage low, the PMOS devices are conducting, pulling the common mode level down towards circuit ground. In normal operation, the protection circuits are turned off and do not affect the operation of the GQD 110.

The two protection circuits, the PMOS transistors 350 and 351, for example, may form a potential divider with the resistors 150 and 156 to drop the level of the input signal to a low level to protect the loop filter 170. When the power supply is lost, the "CONTROL VOLTAGE C" may be at ground potential and thus the protection provided by the two protection circuits may still be in effect. Although shown to be PMOS transistors, other types of transistors, such as NMOS, BJT, DMOS, and so forth, may be used with modification to the protection circuits. The illustration and discussion of PMOS transistors should not be construed as being limiting to either the scope or the spirit of the present invention.

Although shown as single transistors, the current sinks (NMOS transistors 310 and 311, for example), the current sources (PMOS transistors 330 and 331, for example), and the protection circuits (PMOS transistors 350 and 351, for example) may be implemented using multiple transistors arranged in parallel if additional current sourcing and sinking capabilities are needed, with the number and size of the transistors as needed to provide the required current handling capabilities, manufacturing process limitations, and so forth.

The current sinks in the circuit 300, NMOS transistors 310 and 311, for example, may need to be tuned (adjusted). The control voltage "CONTROL VOLTAGE A" may need to be generated based on the input signal's common mode level as well as the desired common mode level.

Figure 4:
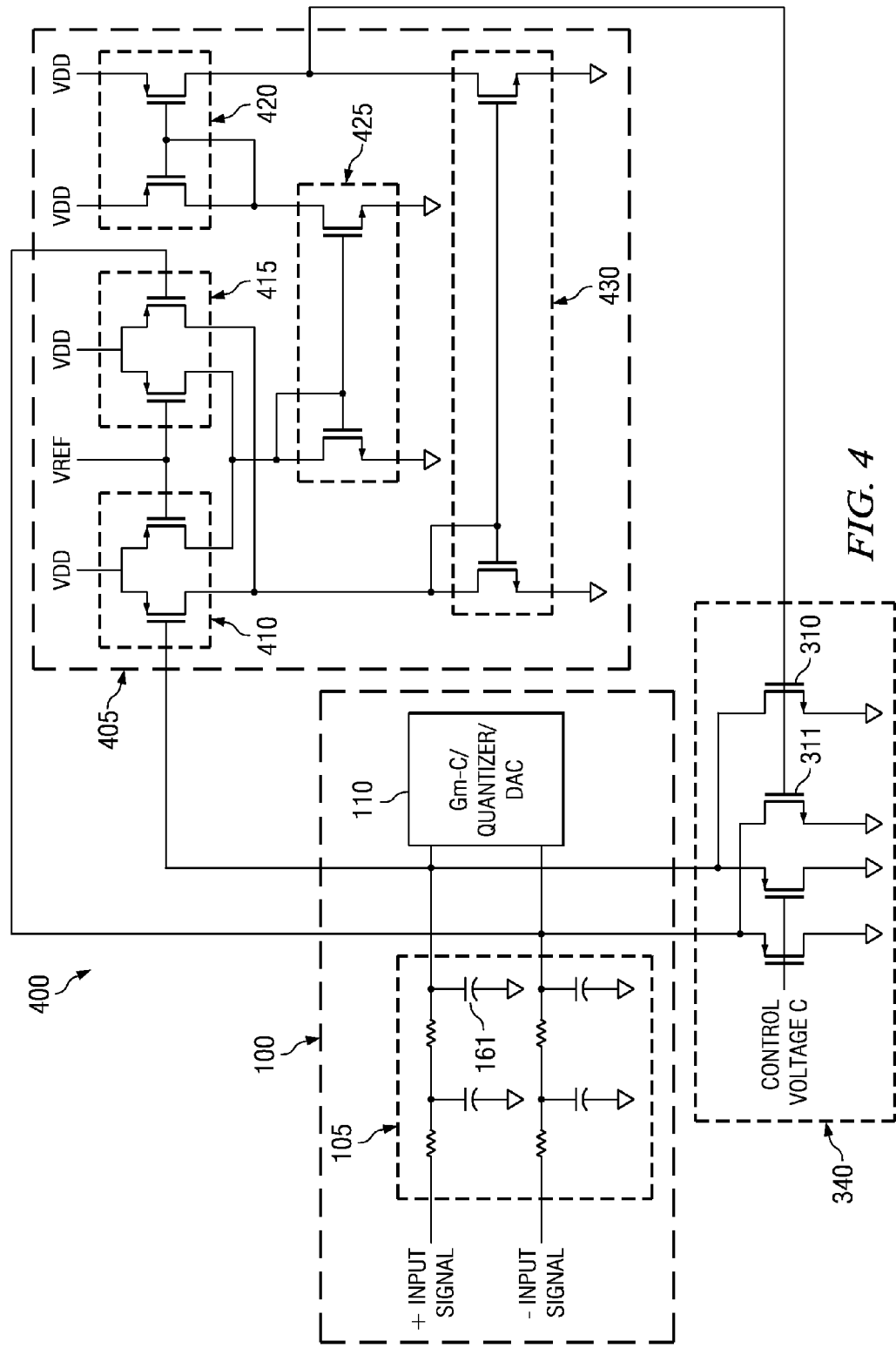
FIG. 4 is a diagram of a schematic of an exemplary continuous-time sigma-delta ADC with a common mode adjust circuit.

With reference now to FIG. 4, there is shown a diagram illustrating a schematic of a continuous-time sigma-delta ADC 400 with a tuning circuit 405 for setting a control voltage used to tune current sinks to set a common mode level. The continuous-time sigma-delta ADC 400 includes the continuous-time sigma-delta ADC 100 with the circuit 340 for common mode level protection with additional supply loss protection. The tuning circuit 405 may be coupled to the continuous-time sigma-delta ADC 400 at the inputs to the GQD 110 like the circuit 340. The tuning circuit 405 may compare both a positive input to the GQD 110 and a negative input to the GQD 110 to a reference signal "VREF," which may represent the desired common mode level. The comparison between the positive input to the GQD 110 and the reference signal may take place in a first pair of transistors 410, while a second pair of transistors 415 may perform the comparison between the negative input to the GQD 110 and the reference signal. Current mirrors 420, 425, and 430 provide necessary current to assert a bias voltage to control the state of the current sinks (transistors 310 and 311, for example) in the circuit 340.

If there is no difference between the level of the positive input to the GQD 110 and the negative input to the GQD 110 (collectively, the common mode level of the input signal) and the reference signal (the desired common mode level), then the applied bias voltage goes to zero and the current sinks of the circuit 340 are turned off. If there is a positive difference between the level of the positive input to the GQD 110 and the negative input to the GQD 110 (the common mode level of the input signal) and the reference signal (the desired common mode level), then a positive bias voltage is applied to the current sinks of the circuit 340 and the current sinks are turned on and the inputs (both the positive and the negative inputs) of the GQD 110 may be pulled down towards the desired common mode level.

The first pair of transistors 410 and the second pair of transistors 415 may become part of the capacitance needed at the input of the GQD 110 and combine with capacitors in the RC network 105 to help reduce the overall capacitance of the capacitors in the RC network 105, such as the capacitor 161. The configuration as shown in FIG. 4 may have a reduced additional integrated circuit real estate requirement that includes the remaining transistors in the current mirrors 420, 425, and 430. Additionally, since the capacitors in the RC network 105 are referenced to ground and the transistors in the first pair of transistors 410 and the second pair of transistors 415 are reference to the supply (VDD), better capacitance linearity at the input of the GQD 110 may be achieved. The improved capacitance linearity may improve the overall performance of the continuous-time sigma-delta ADC 400.

Figure 5:
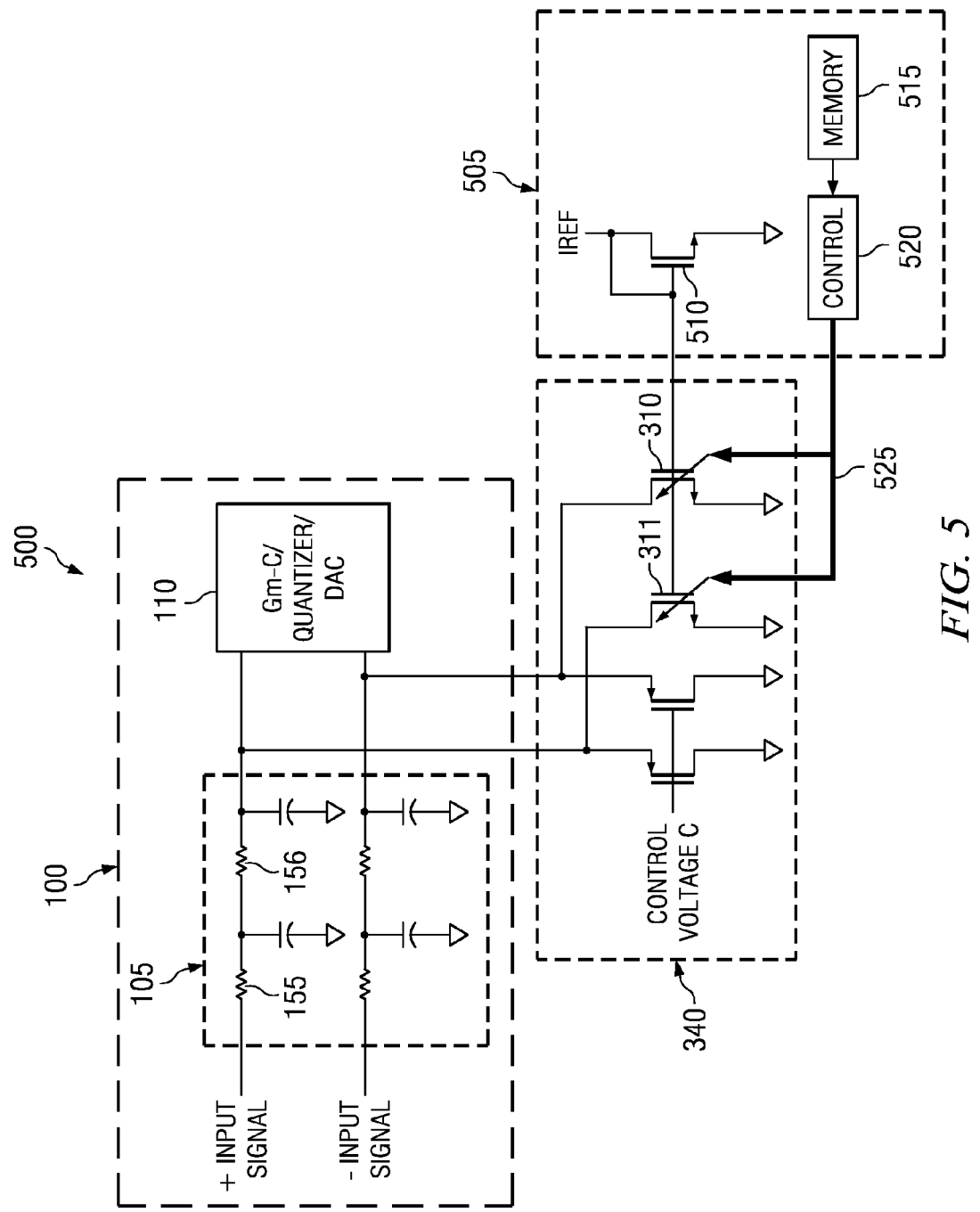
FIG. 5 is a diagram of a schematic of an exemplary continuous-time sigma-delta ADC with a common mode adjust circuit.

With reference now to FIG. 5, there is shown a diagram illustrating a schematic of a continuous-time sigma-delta ADC 500 with a tuning circuit 505 for setting a control voltage used to tune current sinks to set a common mode level. The tuning circuit 505 includes a diode connected transistor 510 that may be used to generate a bias voltage to control the state of the current sinks (transistors 310 and 311, for example) in the circuit 340. The current sinks may be operated as current mirrors.

A reference current "IREF" of the diode connected transistor 510 may be defined as VBG/RINT, where VBG is a band-gap voltage and RINT is a resistor similar (manufactured using the same manufacturing process) to the resistors in the RC network 105, such as the resistors 155 and 156. With the resistor RINT being manufactured with the same manufacturing process as the resistors in the RC network 105, it may be ensured that a voltage drop across the resistors in the RC network 105, such as the resistors 155 and 156, may be accurately set by the band-gap voltage (VGB) and a ratio between the resistor RINT and a sum of the resistors in the RC network 105 (resistors 155 and 156).

The setting of the voltage drop across the resistors in the RC network 105 (a measure of programmability) may be implemented digitally through switching additional current sinks (similar to transistors 310 and 311) in the circuit 340 by a control bus "CONTROL." Depending upon the value of the voltage drop across the resistors in the RC network 105, a number of current sinks may be turned on or turned off as needed. This may require prior knowledge of the input signal's common mode level in order to turn on the required number of current sinks.

However, since there is a limited number of unique RF integrated circuits that may be attached to the continuous-time sigma-delta ADC 500 and provide the input signals, it may be possible to determine a typical common mode level for each unique RF integrated circuit and store them in a memory 515 of the continuous-time sigma-delta ADC 500. This may occur during manufacture of the continuous-time sigma-delta ADC 500 or it may occur during manufacture of a system containing the continuous-time sigma-delta ADC 500. The manufacturer may specify the RF integrated circuit that may be coupled to the continuous-time sigma-delta ADC 500, and then based on a reference to the memory 515, a control circuit 520 may turn on a number of current sinks (via a control bus 525) that may need to be turned on to properly set the voltage drop across the resistors in the RC network 105.

With reference now to FIGS. 6a through 6c, there are shown diagrams illustrating sequences of events in adjusting the common mode level of an input signal provided to a continuous-time sigma-delta ADC. The diagram shown in FIG. 6a illustrates a high-level sequence of events 600 in adjusting the common mode level of an input signal provided to a continuous-time sigma-delta ADC. The adjusting of the common mode level may begin with a determining of a difference between the common mode level of the input signal and a desired common mode level (block 605). The difference between the common mode level and the desired common mode level may then be used to generate a compensation voltage (block 610) that may be applied to a tuning circuit to bring the common mode level to a level about equal to the desired common mode level (block 615).

The diagram shown in FIG. 6b illustrates a sequence of events 630 used in adjusting the common mode level of an input signal provided to a continuous-time sigma-delta ADC, wherein a tuning circuit similar to the tuning circuit 405 is utilized to perform the adjusting. The sequence of events 630 may be an implementation of the sequence of events 600 modified to meet the specific requirements of the tuning circuit 405. The tuning of the common mode level may begin with a comparison of the input signals to the continuous-time sigma-delta ADC with the desired common mode level (block 635). The comparison may be an implementation of the determining of the difference between the common mode level of the input signal and the desired common mode level (block 605). The comparison may be performed by the first pair of transistors 410 and the second pair of transistors 415, for example. Then, a bias voltage may be generated based on the comparison of the common mode level and the desired common mode level (block 640) and may be an implementation of the generating of the compensation voltage (block 610). Current mirrors 420, 425, and 430 may be used to generate the compensation voltage, for example. The bias voltage may then be provided to current sinks to change the common mode level (block 645).

The diagram shown in FIG. 6c illustrates a sequence of events 660 used in adjusting the common mode level of an input signal provided to a continuous-time sigma-delta ADC, wherein a tuning circuit similar to the tuning circuit 505 is utilized to perform the adjusting. The sequence of events 660 may be an implementation of the sequence of events 600 modified to meet the specific requirements of the tuning circuit 505. The tuning of the common mode level may begin with the specifying of the type and make of an integrated circuit, such as an RF chip, that may be providing the input signal to the continuous-time sigma-delta ADC (block 665). The specifying may be an implementation of the determining of the difference between the common mode level of the input signal and the desired common mode level (block 605) since each type and make of integrated circuit may be characterized by a typical common mode level for output signals provided. With the specified type and make of integrated circuit, it may be possible to retrieve a compensation voltage, from a memory, for example (block 670) and may be an implementation of the generating of the compensation voltage (block 610). With the compensation voltage, a number of current sinks may be turned on to provide a requisite voltage drop necessary to place a common mode level at the input of a GQD that is substantially equal to the desired common mode level (block 675). The voltage drop may be realized across the resistors that are part of an RC network present in a loop filter of the continuous-time sigma-delta ADC.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of controlling a common mode input voltage at a differential input port of a feedback circuit, the feedback circuit coupled to a differential system input through resistors, the method comprising:
    measuring the common mode input voltage at the differential input port;
    comparing the common mode input voltage at the differential input port to a reference voltage; and
    reducing a difference between the common mode input voltage at the differential input port and the reference voltage, the reducing comprising supplying a common mode error current to the differential input port.

2. The method of claim 1, wherein the supplying comprises supplying the common mode error current directly to the differential input port.

3. A method of controlling a common mode input voltage at a differential input port of a feedback circuit, the feedback circuit coupled to a differential system input through resistors, the method comprising:
    measuring the common mode input voltage at the differential input port;
    comparing the common mode input voltage at the differential input port to a reference voltage; and
    reducing a difference between the common mode input voltage at the differential input port and the reference voltage, the reducing comprising supplying a common mode error current to the differential input port, wherein the supplying the common mode error current further comprises:
        generating a control voltage based on the difference between the common mode input voltage and the reference voltage; and
        controlling a plurality of current sources coupled to the differential input port, wherein at least one of the plurality of current sources generates the common mode error current.

4. The method of claim 1, wherein: the feedback circuit comprises a Gm-C/Quantizer/DAC circuit for a sigma-delta ADC; and
    the method further comprises operating the Gm-C/Quantizer/DAC circuit.

5. The method of claim 1, further comprising generating the reference voltage, the generating comprising generating a band-gap voltage.

6. A method of controlling a common mode input voltage at a differential input port of a feedback circuit, the feedback circuit coupled to a differential system input through resistors, the method comprising:
    clamping a voltage at the differential input port to reduce input voltage excursions;
    measuring the common mode input voltage at the differential input port;
    comparing the common mode input voltage at the differential input port to a reference voltage; and
    reducing a difference between the common mode input voltage at the differential input port and the reference voltage, the reducing comprising supplying a common mode error current to the differential input port.

* * * * *